(12) United States Patent
Pyeon et al.

(10) Patent No.: US 8,064,260 B2
(45) Date of Patent: *Nov. 22, 2011

(54) POWER SUPPLIES IN FLASH MEMORY DEVICES AND SYSTEMS

(75) Inventors: Hong Beom Pyeon, Kanata (CA); Jin-Ki Kim, Kanata (CA)

(73) Assignee: MOSAID Technologies Incorporated, Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/903,271

(22) Filed: Oct. 13, 2010

(65) Prior Publication Data

US 2011/0032773 A1   Feb. 10, 2011

Related U.S. Application Data (63) Continuation of application No. 12/115,784, filed on May 6, 2008, now Pat. No. 7,839,689.

(51) Int. Cl.
  *G11C 16/04* (2006.01)
(52) U.S. Cl. .......... 365/185.18; 365/185.29; 365/185.33
(58) Field of Classification Search ............. 365/185.18, 365/185.29, 207, 185.33
  See application file for complete search history.

(56) References Cited

U.S. PATENT DOCUMENTS

| | | | |
|---|---|---|---|
| 5,781,473 A | 7/1998 | Javanifard et al. | |
| 5,940,284 A | 8/1999 | Troutman | |
| 6,316,843 B1 | 11/2001 | Hsu | |
| 6,373,325 B1 | 4/2002 | Kuriyama | |
| 6,429,732 B1 | 8/2002 | Tedrow et al. | |
| 6,473,321 B2 | 10/2002 | Kishmoto et al. | |
| 6,501,325 B1 | 12/2002 | Meng | |
| 6,605,986 B2 | 8/2003 | Tanzawa et al. | |
| 6,614,292 B1 | 9/2003 | Chung et al. | |
| 6,794,927 B2 | 9/2004 | Bedarida et al. | |
| 6,912,155 B2 | 6/2005 | Sakurai et al. | |
| 6,980,045 B1 | 12/2005 | Liu | |
| 7,102,425 B2 | 9/2006 | Lee | |
| 7,149,132 B2 | 12/2006 | Bedeschi et al. | |
| 7,259,611 B2 | 8/2007 | Tanimoto | |
| 7,576,591 B2 | 8/2009 | Conte et al. | |
| 7,839,689 B2 * | 11/2010 | Pyeon et al. ............. | 365/185.18 |
| 2002/0001207 A1 | 1/2002 | Kishimoto et al. | |
| 2003/0184360 A1 | 10/2003 | Wang et al. | |
| 2004/0061139 A1 | 4/2004 | Natori | |
| 2005/0248385 A1 | 11/2005 | Lee | |
| 2006/0114053 A1 | 6/2006 | Sohara | |
| 2007/0115727 A1 | 5/2007 | Jeong | |
| 2008/0089130 A1 | 4/2008 | Park | |

OTHER PUBLICATIONS

Tanzawa, T. et al., "Circuit Techniques for a 1.8-V-Only NAND Flash Memory", IEEE Journal of Solid-State Circuits, vol. 37, No. 1, Jan. 2002, pp. 84-89.

(Continued)

*Primary Examiner* — Huan Hoang
(74) *Attorney, Agent, or Firm* — Don Mollick (57) ABSTRACT

Power supplies in flash memory devices are disclosed. A first section of a flash memory device includes non-volatile memory for storing data. A second section of the flash memory device includes at least first and second pumping circuits. The first pumping circuit receives a first voltage and produces, at an output of the first pumping circuit, a second voltage at a second voltage level that is higher than the first voltage level. The second pumping circuit has an input coupled to the first pumping circuit output for cooperatively employing the first pumping circuit to pump up from a voltage greater than the first voltage to produce a third voltage at a third voltage level that is higher than the second voltage level.

16 Claims, 12 Drawing Sheets

OTHER PUBLICATIONS

Tanzawa, et al. "A Stable Programming Pulse Generator for Single Power Supply Flash Memories", IEEE Journal of Solid-State Circuits, vol. 32, No. 6, pp. 845-851, Jun. 1997.

Tanzawa, et al., "A Dynamic Analysis of the Dickson Charge Pump Circuit", IEEE J. Solid-State Circuits, vol. 32, No. 8, pp. 1231-1240, Aug. 1997.

* cited by examiner

FIG. 11

POWER SUPPLIES IN FLASH MEMORY DEVICES AND SYSTEMS

CROSS-REFERENCE TO RELATED APPLICATION

This application is a continuation of U.S. application Ser. No. 12/115,784 filed on May 6, 2008, which claims the benefit of U.S. Provisional Patent Application No. 61/025,003 filed on Jan. 31, 2008, the entire contents of which are hereby incorporated by reference.

BACKGROUND OF THE DISCLOSURE

Flash memory is a commonly used type of non-volatile memory in widespread use as mass storage for consumer electronics, such as digital cameras and portable digital music players for example. As process technology shrinks the cell size, an important issue for this type of memory is density of the memory. In order to achieve higher cell efficiency from the cell array, the peripheral block size may be optimized. In this regard, a challenge is an apparent need for power supplies having diverse voltage generators. As will be appreciated by those skilled in the art, the power supply generators of flash memories make different voltage levels according to the operating state of the memory. Also, generating a higher supply voltage from the source voltage requires pumping circuits to boost up to the high supply voltage from the source voltage, which is typically referred to as $V_{DD}$. In some examples, $V_{DD}$ is about 1.5V, or even significantly less.

One existing method of generating more than one higher voltage levels from a single power supply voltage is to use a charge pump circuit having a fixed number of stages to generate a voltage level. Other voltage levels can be provided using voltage divider networks in conjunction with the single charge pump. A disadvantage of this approach is that power is wasted on the voltage divider networks. Another disadvantage may be that using a fixed number of stages sacrifices performance at one power supply voltage to accommodate another power supply voltage. Along with the above-mentioned disadvantages, each power supply voltage has different current driving capability based on the operating state and, as such, those skilled in the art will appreciate that a divider-based, power supplies generation approach may not be suitable in the context of flash memory.

Figure 1:
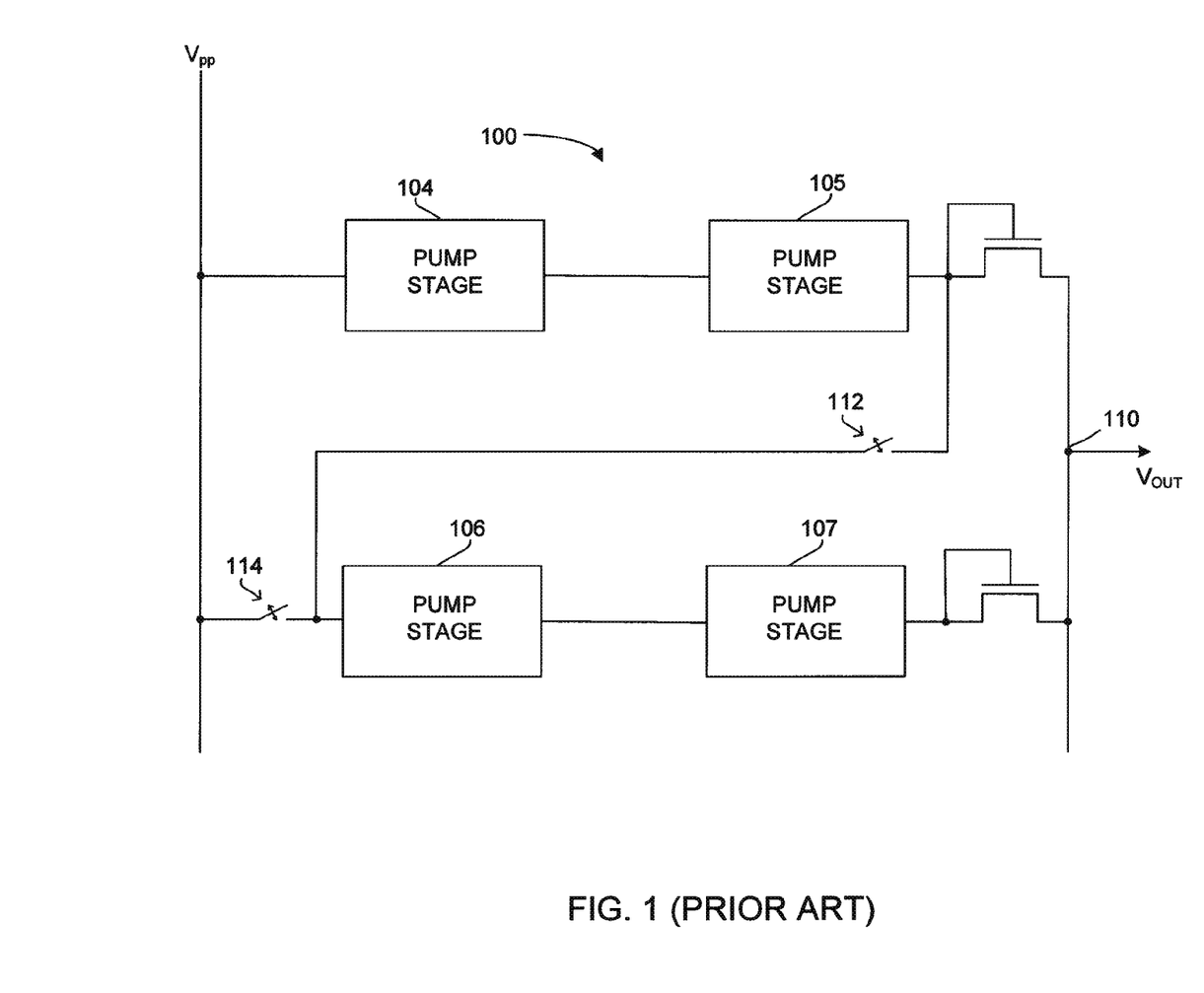
FIG. 1 is a block diagram of a multi-stage charge pump in accordance with the prior art.

Another approach in providing for two or more power supply generations is through the use of more than one electrical switches among more than one pumping circuits as shown in FIG. 1, a diagram of a charge pump 100 having a plurality of stages 104-107. It may be seen that the main purpose of the illustrated approach is to take two or more voltage levels from a same output 110. By controlling which of switches 112 and 114 are turned on, $V_{out}$ voltage level can be varied depending upon whether voltage boosting from the pump stage pair 104, 105 is added to voltage boosting from the pump stage pair 106, 107 by series coupling of the pairs. Output current can also be varied by means of the switches 112 and 114. In particular, if both the switches 112 and 114 are turned off, only the pump stage pair 104, 105 sources output current through the output 110. If the switch 112 is off and the switch 114 is on, there is parallel coupling of the pump stage pairs, and both pump stage pairs source output current through the output 110.

Consider for a moment attempting to apply the approach of FIG. 1 in a non-volatile memory device such as, for example, a flash memory device. A problem that would be encountered is that if the $V_{out}$ at the output 110 were to be used to make two or more power supply levels in the flash memory, there would be a common connection between two different voltage levels that are used in different places. For example, $V_{pgm}$ and $V_{erase}$ power supply voltage levels are connected to the gate of the selected cell and the substrate, respectively. So, in order to electrically switch the voltage level from the single output ($V_{out}$), any switch would have to be placed between the output 110, and $V_{pgm}$ and $V_{erase}$ voltage nodes. Such switch control would demand other local boosting to transmit the pumped power without a threshold voltage loss from the switch. Thus, the approach of FIG. 1 would not be a reliable solution for more than one voltage generations.

Accordingly, there is a need in the industry for an improved way of making two or more voltage levels in a flash memory.

SUMMARY

It is an object of the invention to provide an improved nonvolatile memory device.

According to one aspect of the invention, there is provided a device configured for supplying, within the device, a first voltage at a first voltage level. The device includes a first section that includes non-volatile memory for storing data. A second section includes at least first and second pumping circuits. The second section is a peripheral circuit section. The first pumping circuit receives the first voltage and produces, at an output of the first pumping circuit, a second voltage at a second voltage level that is higher than the first voltage level. The second voltage is required for carrying out a first type of memory operation associated with the non-volatile memory. The second pumping circuit has an input coupled to the first pumping circuit output for cooperatively employing the first pumping circuit to pump up from a voltage greater than the first voltage to produce a third voltage at a third voltage level that is higher than the second voltage level. The third voltage is required for carrying out a second type of memory operation associated with the non-volatile memory.

According to another aspect of the invention, there is provided a system for producing higher voltages than a first voltage at a first voltage level. The system includes first charge pump circuitry that includes a first chain of transistors for receiving the first voltage at an end of the first chain and for producing, at an opposite end of the first chain, a second voltage at a second voltage level that is higher than the first voltage level. Second charge pump circuitry includes a second chain of transistors for receiving a third voltage at a third voltage level at an end of the second chain. The third voltage level is at least one transistor threshold voltage ($V_{tn}$) less than the second voltage. The second charge pump circuitry is adapted to produce, at an opposite end of the second chain, a fourth voltage at a fourth voltage level that is higher than the second voltage level. A level shifter has an output for outputting a level-shifted voltage. A switch has a control electrode coupled to the output of the level shifter. The switch controls, based on the level-shifted voltage, whether the output of the first charge pump circuitry is communicated to an input of the second charge pump circuitry.

According to yet another aspect of the invention, there is provided a method of producing voltages in a device having a first section including non-volatile memory for storing data, and also having a second section including at least first and second pumping circuits. The method includes supplying, within the device, a first voltage at a first voltage level to the first pumping circuit. The method also includes producing, at an output of the first pumping circuit, a second voltage at a second voltage level that is higher than the first voltage level.

The second voltage is required for carrying out a first type of memory operation associated with the non-volatile memory. The method also includes producing, at an output of the second pumping circuit, a third voltage by cooperatively employing the first pumping circuit to pump up from a voltage greater than the first voltage. The third voltage is at a third voltage level that is higher than the second voltage level. The third voltage is required for carrying out a second type of memory operation associated with the non-volatile memory.

Thus, an improved nonvolatile memory has been provided.

BRIEF DESCRIPTION OF THE DRAWINGS

Reference will now be made, by way of example, to the accompanying drawings.

Similar or the same reference numerals may have been used in different figures to denote similar components.

DETAILED DESCRIPTION OF EXAMPLE EMBODIMENTS

Certain terms/expressions used herein have a specific meaning:

"Current carrying electrode" as used herein means an electrode of a transistor that carries current such as, for example, the drain or source of a Field-Effect Transistor (FET), or the collector or emitter of a Bipolar Junction Transistor (BJT).

"Control electrode" as used herein means an electrode of a transistor having control function such as, for example, the gate of a FET, or the base of a BJT.

The peripheral circuit area of flash memory devices include circuits for generating a number of high voltage levels from a single power supply voltage. In order to generate these high voltage levels, those skilled in the art will appreciate that the peripheral circuit areas typically include a number of charge pump circuits, each having a fixed number of stages.

Figure 2A:
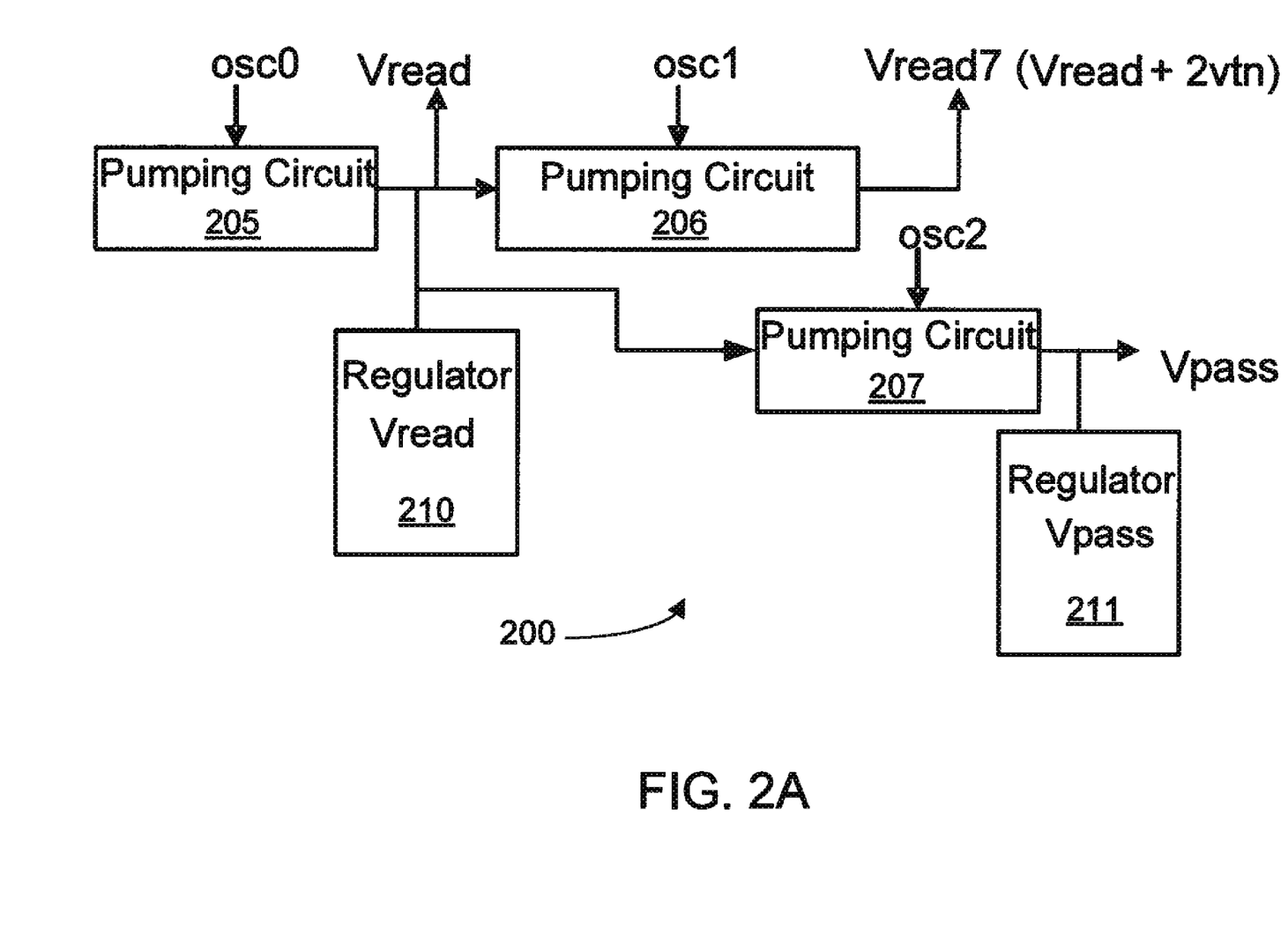
FIGS. 2A and 2B are block diagrams of first and second portions, respectively, of a charge pump system in accordance with an example embodiment.

Referring now to FIG. 2A, shown is a first portion 200 of a charge pump system in accordance with an example embodiment. The portion 200 of the illustrated charge pump system includes three pumping circuits 205-207 (oscillators controlling them as indicated by inwardly pointing arrows above the blocks) and two regulator circuits 210-211. These system components will be described in greater detail subsequently; however for the purposes of briefly addressing functionality now, it will be noted that the pumping circuit 205 provides voltage $V_{read}$, and that the pumping circuit 206 provides voltage $V_{read7}$, and also that the pumping circuit 207 provides voltage $V_{pass}$. Also, the regulator circuit 210 regulates the voltage $V_{read}$, and the regulator circuit 211 regulates the voltage $V_{pass}$.

Figure 2B:
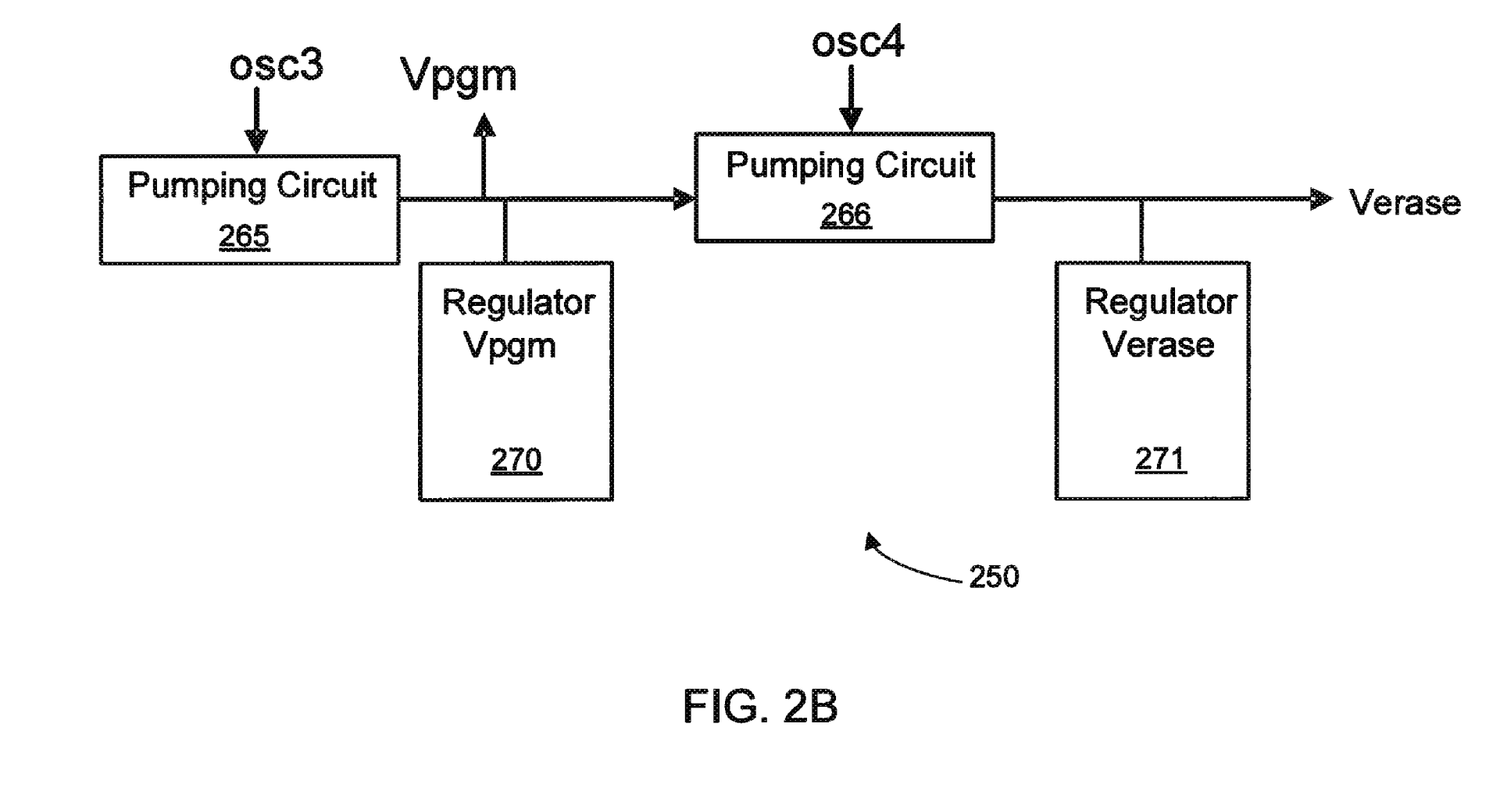

Turning now to FIG. 2B, shown is a second portion 250 of the above-described charge pump system. For convenience of the present discussion, it may be useful to identify the second portion 250 as the portion providing higher voltages, and also to analogously qualify the first portion 200 as the portion providing lower voltages. This is because the illustrated second portion 250 provides voltages $V_{pgm}$ and $V_{erase}$ which, in at least some examples, are higher voltages than the three voltages provided by the system's first portion. In one example, $V_{erase}$ is about 20.0V, $V_{pgm}$ is in the range of roughly 12.0V to 18.0V, and the other three voltages provided by the system's first portion are all lower than $V_{erase}$ and $V_{pgm}$. It will be understood however that $V_{erase}$ and $V_{pgm}$ may vary from one example to other different examples.

The illustrated second portion 250 includes two pumping circuits 265-266 (oscillators controlling them as indicated by inwardly pointing arrows above the blocks) and two regulator circuits 270-271. These system components will be described in greater detail subsequently; however for the purposes of briefly addressing functionality now, it will be noted that the pumping circuit 265 provides voltage $V_{pgm}$, and that the pumping circuit 266 provides voltage $V_{erase}$. Also, the regulator circuit 270 regulates the voltage $V_{pgm}$, and the regulator circuit 271 regulates the voltage $V_{erase}$.

Different operations of a flash device require different voltages. For example, a page read operation may require voltages $V_{read}$ and $V_{read7}$. For the charge pump system of FIGS. 2A and 2B, obtaining these voltages would mean activation of the oscillators controlling the pumping circuits 205 and 206. As another example, a page program operation may require voltages $V_{pass}$ and $V_{pgm}$. For the charge pump system of FIGS. 2A and 2B, obtaining these voltages would mean activation of the oscillators controlling the pumping circuits 205, 207 and 265. As yet another example, an erase operation may require voltage $V_{erase}$. For the charge pump system of FIGS. 2A and 2B, obtaining this voltage would mean activation of the oscillators controlling the pumping circuits 265 and 266.

The example embodiment of FIGS. 2A and 2B relies upon a characteristic of flash in that internal power supplies of the memory do not need to be generated at the same time and used simultaneously when one operation is issued. This permits electrical connection of an unused pumping stage to a used pumping stage to make a higher voltage level by way of the electrical connection. Each voltage level may have a unique value so that use in a common connections, common output port manner may be avoided.

It will be understood that, for the illustrated example embodiment, the voltage levels of $V_{read}$ and $V_{pgm}$ may be raised without adversely impacting issued flash memory operations of page program and erase. As will be appreciated by those skilled in the art, the raised voltage levels of $V_{read}$ and $V_{pgm}$ are not transmitted to the gate of any selected cell due to the decoding scheme of flash memories.

Figure 3:
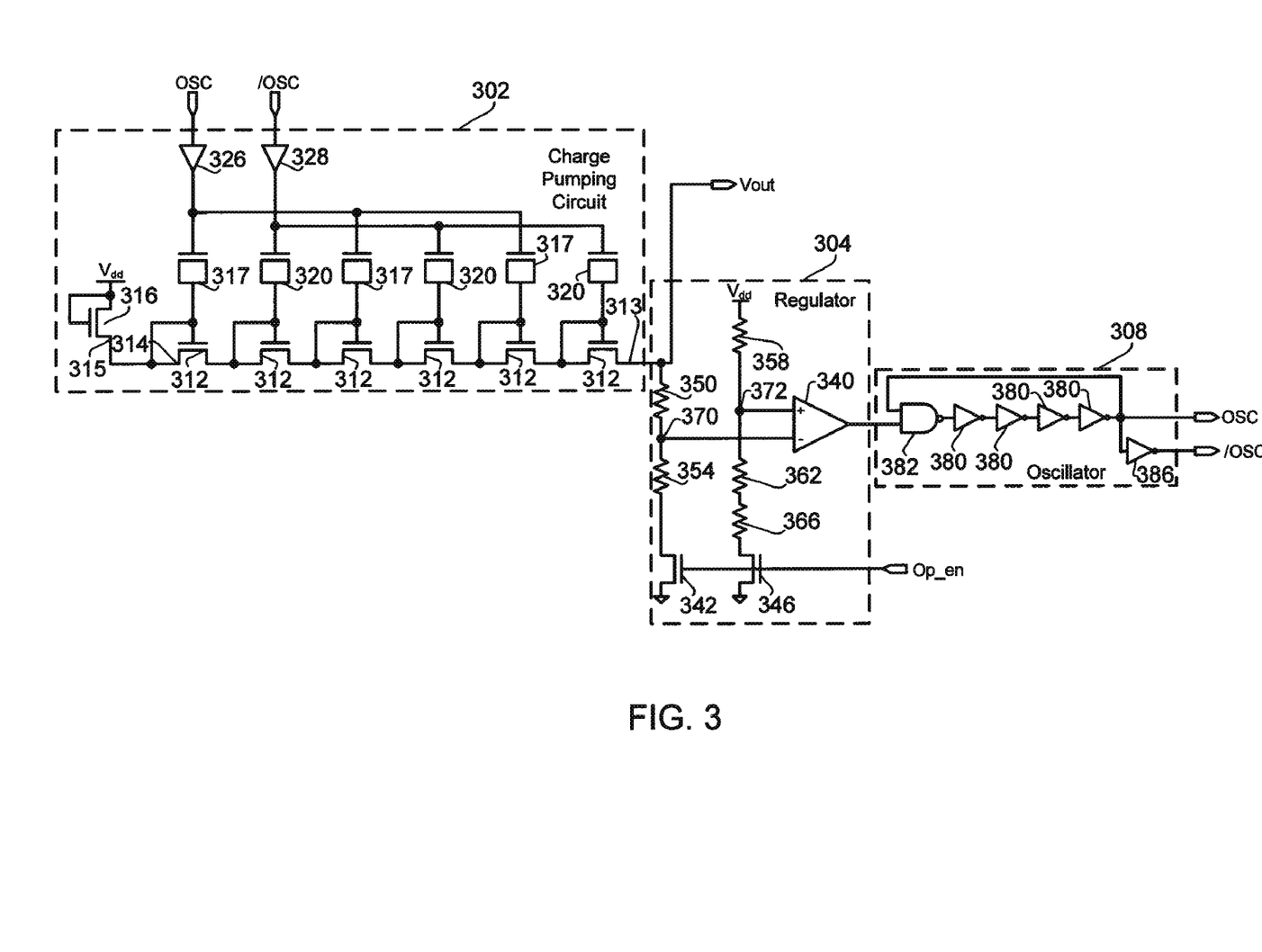
FIG. 3 is a detailed circuit schematic of a number of system components used in some examples of the charge pump system of FIGS. 2A and 2B.

Charge pump systems in accordance with example embodiments will now be discussed in greater non-limiting detail by way of a description of simplified circuit schematics below. Beginning with the firstly presented, detailed circuit schematic of FIG. 3, shown are three charge pump system components. In particular, a pumping circuit 302, a regulator circuit 304 and oscillator circuitry 308 are shown. In some examples, the pumping circuits 205 and 265 of FIGS. 2A and 2B are implemented as the pumping circuit 302 is shown. Also in such examples, the regulator circuits 210, 211 and 271 of FIGS. 2A and 2B are implemented as the regulator circuit 304 is shown.

Still with reference to FIG. 3, the illustrated pumping circuit 302 (sometimes referred to as a Dickson charge pump) includes a plurality of NMOS transistors 312 chained together source-to-drain with a FET source 313 at one end of the chain of transistors (switches) electrically connected to the output of the pumping circuit 302, and a FET drain 314 at the other end of the chain electrically connected to source 315 of an NMOS transistor 316 in forward-biased diode configuration between $V_{DD}$ and the FET drain 314. The illustrated pumping circuit 302 also includes a first number of capacitors 317 (three in the illustrated example, but in other examples the number of capacitors may be some other suitable number) as well as a second same number of capacitors 320. Oscillation signal (OSC) is provided to first terminals of the capacitors 317 through a buffer 326, and similarly the complement of OSC (/OSC) is provided to first terminals of the capacitors 320 through a buffer 328. Each of the other terminals of the capacitors 317 and 320 are connected to a different one of the gates of the NMOS transistors 312.

In operation, the voltages at nodes between switches in the chain of switches are not reset after each pumping cycle so that the average node voltage potentials (e.g., voltages of the nodes between one switch and the next in the chain of switches) increase progressively from the input to the output of the switch chain to produce voltage $V_{out}$. This operation is similar in principle to the well-known "bootstrap" technique often used in MOS integrated circuits to multiply voltages.

As previously mentioned, illustrated in FIG. 3 in addition to the pumping circuit 302 is the regulator circuit 304. Voltage regulators are, in and of themselves well known to those skilled in the art, and typically have the function of providing an output voltage that is as constant as possible despite receiving as input, a voltage with a relatively large ripple component.

The illustrated regulator circuit 304 includes an op amp 340, two NMOS transistors 342 and 346, a first voltage divider comprising resistive elements 350 and 354, and a second voltage divider comprising resistive elements 358, 362 and 366. A first end of the first voltage divider is electrically connected to the output of the pumping circuit 302. The other end of the first voltage divider is electrically connected to the drain of the NMOS transistor 342. A node 370 is between the resistive elements 350 and 354, and these resistive elements have terminals that are electrically connected to the inverting input of the op amp 340 through the node 370. A node 372 is between the resistive elements 358 and 362, and these resistive elements have terminals that are electrically connected to the non-inverting input of the op amp 340 through the node 372. With respect to the NMOS transistors 342 and 346, a signal Op_en is applied to both their gates. When Op_en is logical high, the NMOS transistors 342 and 346 are turned on and the regulator circuit 304 will be active. When Op_en is logical low, the NMOS transistors 342 and 346 are turned off and the regulator circuit 304 will be inactive.

As previously mentioned, illustrated in FIG. 3 in addition to the regulator circuit 304 is the oscillator 308. Oscillators are, in and of themselves well known to those skilled in the art, and typically have the function of providing an output signal that periodically oscillates between logical low and logical high. Those skilled in the art will appreciate that the illustrated oscillator 308, which is commonly referred to as a ring oscillator, is one of many potentially suitable oscillators which may be employed in at least some example embodiments.

The illustrated oscillator 308 includes five stages, the last four of which each employ an inverter 380. Also, the first stage comprises a NAND gate 382 which initializes and controls the oscillator 308. Output oscillation signal (OSC) is inverted through inverter 386 to provide the complement of OSC (/OSC).

Figure 4:
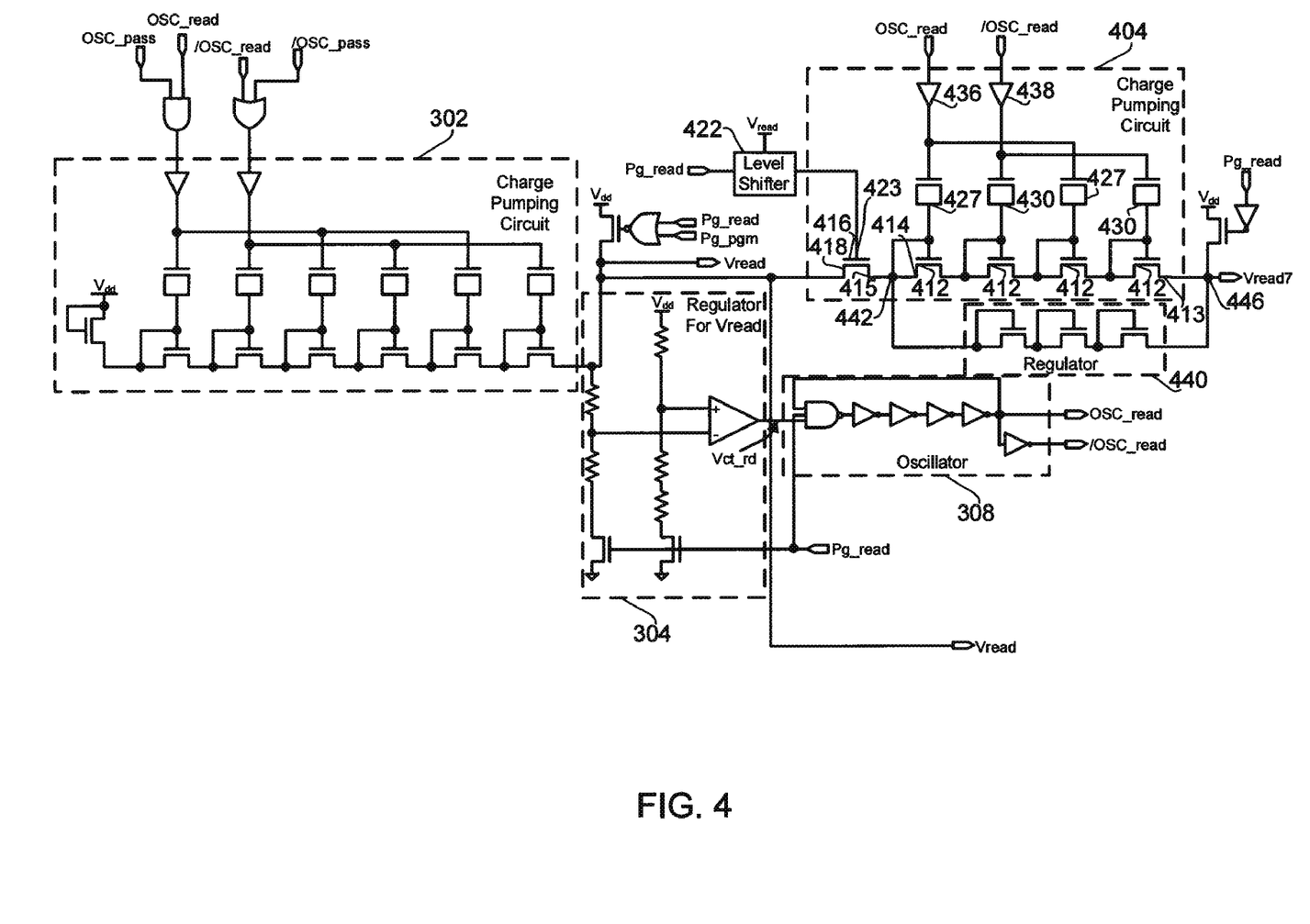
FIG. 4 is a detailed circuit schematic showing again the system components shown in FIG. 3, and also showing a pumping circuit for generating $V_{read7}$ from $V_{read}$.

Reference will now be made to FIG. 4. Shown in this detailed circuit schematic is how the example system component implementations shown in FIG. 3 can fit within the first portion of the charge pump system shown in FIG. 2A. In particular, here the pumping circuit 302 and the regulator circuit 304 function as the $V_{read}$ pumping circuit 205 and the $V_{read}$ regulator circuit 210 respectively. Also, a pumping circuit 404, similar to the pumping circuit 302 but having two instead of three stages, functions as the $V_{read7}$ pumping circuit 206 which is controlled independently by a separate regulator.

Thus, similar to the pumping circuit 302, the illustrated pumping circuit 404 includes a plurality of NMOS transistors 412 chained together source-to-drain with a FET source 413 at one end of the chain of switches electrically connected to the output of the pumping circuit 404, and a FET drain 414 at the other end of the chain electrically connected to source 415 of an NMOS transistor 416. Drain 418 of the NMOS transistor 416 is electrically connected to the output of the pumping circuit 302. In the illustrated example, signal Pg_read, level shifter 422 and the NMOS transistor 416 function to inhibit any reverse voltage drop from $V_{DD}$ through PMOS or from $V_{SS}$ through NMOS. With respect to the level shifter 422, it will be understood that it is provided with a previous pumped voltage level as source voltage of PMOS to provide a high voltage at gate 423 of the NMOS transistor 416. The NMOS transistor 416 is used instead of a PMOS transistor, as PMOS cannot be used in the pumping circuit. This is because the pumped level is higher than $V_{DD}$, such that PMOS would be turned on.

The illustrated pumping circuit 404 also includes a first number of capacitors 427 (two in the illustrated example, but in other examples the number of capacitors may be some other suitable number) as well as a second same number of capacitors 430. OSC_read is provided to first terminals of the capacitors 427 through a buffer 436, and similarly the complement of OSC_read (/OSC_read) is provided to first terminals of the capacitors 430 through a buffer 438. Each of the other terminals of the capacitors 427 and 430 are connected to a different one of the gates of the NMOS transistors 412.

Also illustrated in FIG. 4 is a regulator circuit 440. For the illustrated example, $V_{read7}$ is two NMOS $V_{tn}$ levels above $V_{read}$, and the regulator circuit 440 brings $V_{read7}$ to that level as will be presently explained. Firstly, from the output of the charge pumping circuit 302 to node 442, there is a $V_{tn}$ voltage drop across the NMOS transistor 416. This brings the voltage level at the node 442 to $V_{read}-V_{tn}$. Next, the voltage at node 446 is three NMOS $V_{tn}$ levels above the voltage at the node 442 because the regulator 440 comprises three diode-configured NMOS transistors connected in series. Therefore, the voltage output of the $V_{read7}$ pumping circuit, which is the voltage at the node 446, is $V_{read}-V_{tn}+3V_{tn}$, which equals two NMOS $V_{tn}$ levels above $V_{read}$.

Figure 5:
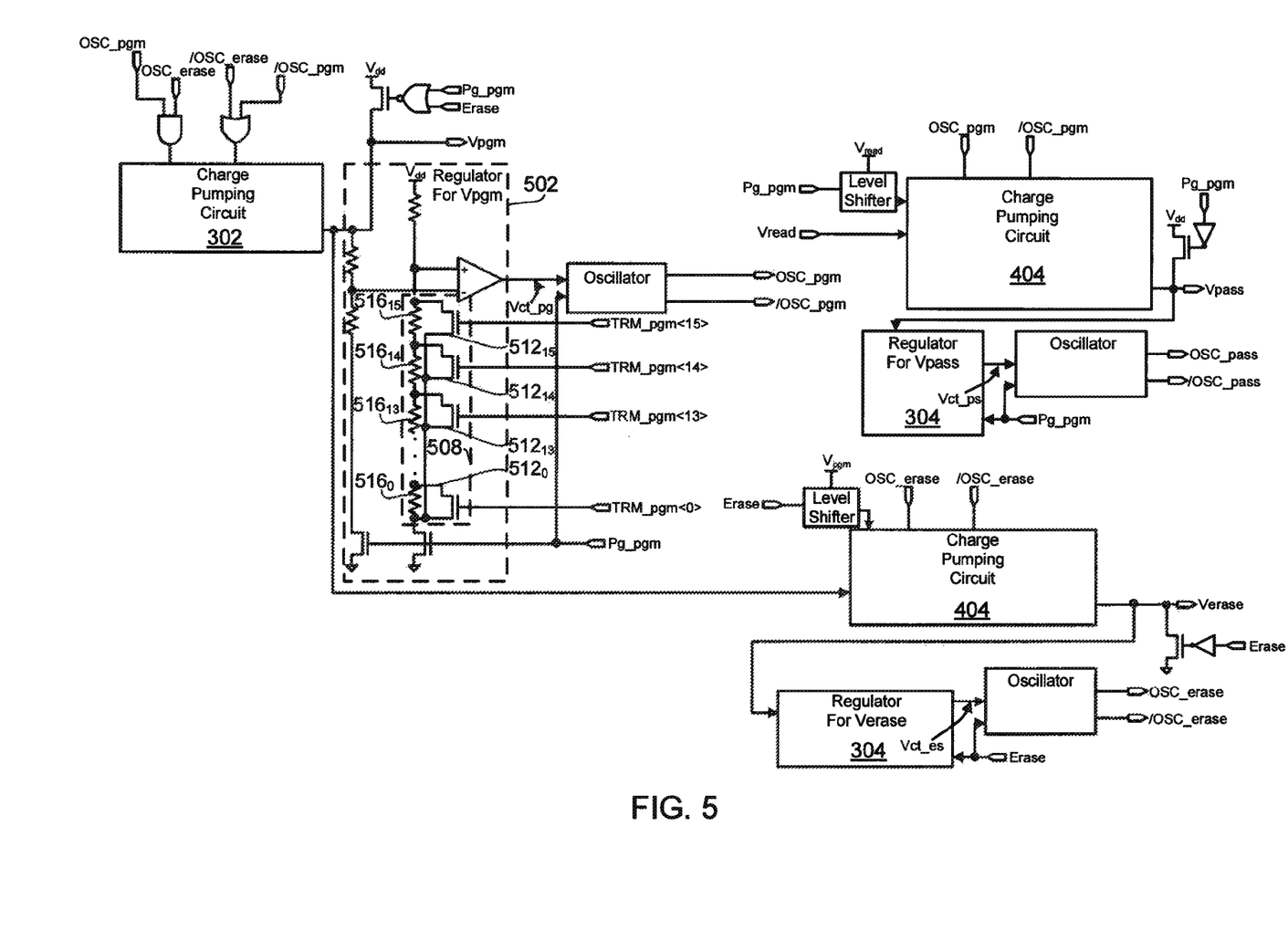
FIG. 5 is a block diagram showing further example details of some of the system blocks shown in FIGS. 2A and 2B.

Reference will now be made to FIG. 5. This figure shows how example system component implementations shown in FIGS. 3 and 4 may be made use of again in the remainder (i.e. what is not shown in FIG. 4) of the charge pump system. In particular, the illustrated example shows that the pumping circuit 404 and the regulator circuit 304 may be employed as the $V_{pass}$ pumping circuit and the $V_{pass}$ regulator circuit respectively. The illustrated example also shows that the regulator circuit 304 may be employed as the $V_{erase}$ regulator circuit; however the resistive elements of the $V_{erase}$ regulator circuit have different resistance values than other regulator circuits of the charge pump system such as, for example, the $V_{pass}$ regulator circuit. It will be appreciated that the exact resistance values can be determined by one skilled in the art without experimentation, and vary depending on the associated high voltage level being regulated.

The illustrated example also shows that the pumping circuit 404 may be employed as the $V_{erase}$ pumping circuit. In terms of the $V_{pgm}$ pumping circuit, the pumping circuit 302 may be employed.

Still with reference to FIG. 5, $V_{pgm}$ regulator circuit 502 is similar to the regulator 304; however it includes additional circuitry (trimming control circuitry) 508. The regulator circuit 502 includes this additional circuitry because of the variable nature of $V_{pgm}$ voltage whose value depends on the program cycles and the cell program states of the selected page.

The $V_{pgm}$ voltage is varied using sixteen control signals, TRM_pgm<15:0>. In at least some examples, only one of TRM_pgm<15:0> will be logical high at any instance and the remaining fifteen control signals will be logical low. If TRM_pgm[15] is logical high, then NMOS transistor $512_{15}$ will be turned on and all resistors $516_{15}$-$516_0$ will be short-circuited. Continuing on, if TRM_pgm[14] is logical high, then NMOS transistor $512_{14}$ will be turned on and the resistors $516_{14}$-$516_0$ will be short-circuited (in other words, every resistor except the resistor $516_{15}$). Table 1 below lists which of the resistors $516_{15}$-$516_0$ will be short-circuited when a selected one of TRM_pgm<15:0> is logical high and the remaining control signals are logical low.

TABLE 1

TRM_pgm < 15:0 > trimming control

| Control Signal | NMOS FET Turned On | Resistor(s) Short-Circuited |
| --- | --- | --- |
| TRM_pgm[15] | $512_{15}$ | $516_{15}$-$516_0$ |
| TRM_pgm[14] | $512_{14}$ | $516_{14}$-$516_0$ |
| TRM_pgm[13] | $512_{13}$ | $516_{13}$-$516_0$ |
| TRM_pgm[12] | $512_{12}$ | $516_{12}$-$516_0$ |
| TRM_pgm[11] | $512_{11}$ | $516_{11}$-$516_0$ |
| TRM_pgm[10] | $512_{10}$ | $516_{10}$-$516_0$ |
| TRM_pgm[9] | $512_9$ | $516_9$-$516_0$ |
| TRM_pgm[8] | $512_8$ | $516_8$-$516_0$ |
| TRM_pgm[7] | $512_7$ | $516_7$-$516_0$ |
| TRM_pgm[6] | $512_6$ | $516_6$-$516_0$ |
| TRM_pgm[5] | $512_5$ | $516_5$-$516_0$ |
| TRM_pgm[4] | $512_4$ | $516_4$-$516_0$ |
| TRM_pgm[3] | $512_3$ | $516_3$-$516_0$ |
| TRM_pgm[2] | $512_2$ | $516_2$-$516_0$ |
| TRM_pgm[1] | $512_1$ | $516_1$-$516_0$ |
| TRM_pgm[0] | $512_0$ | $516_0$ |

Figure 6:
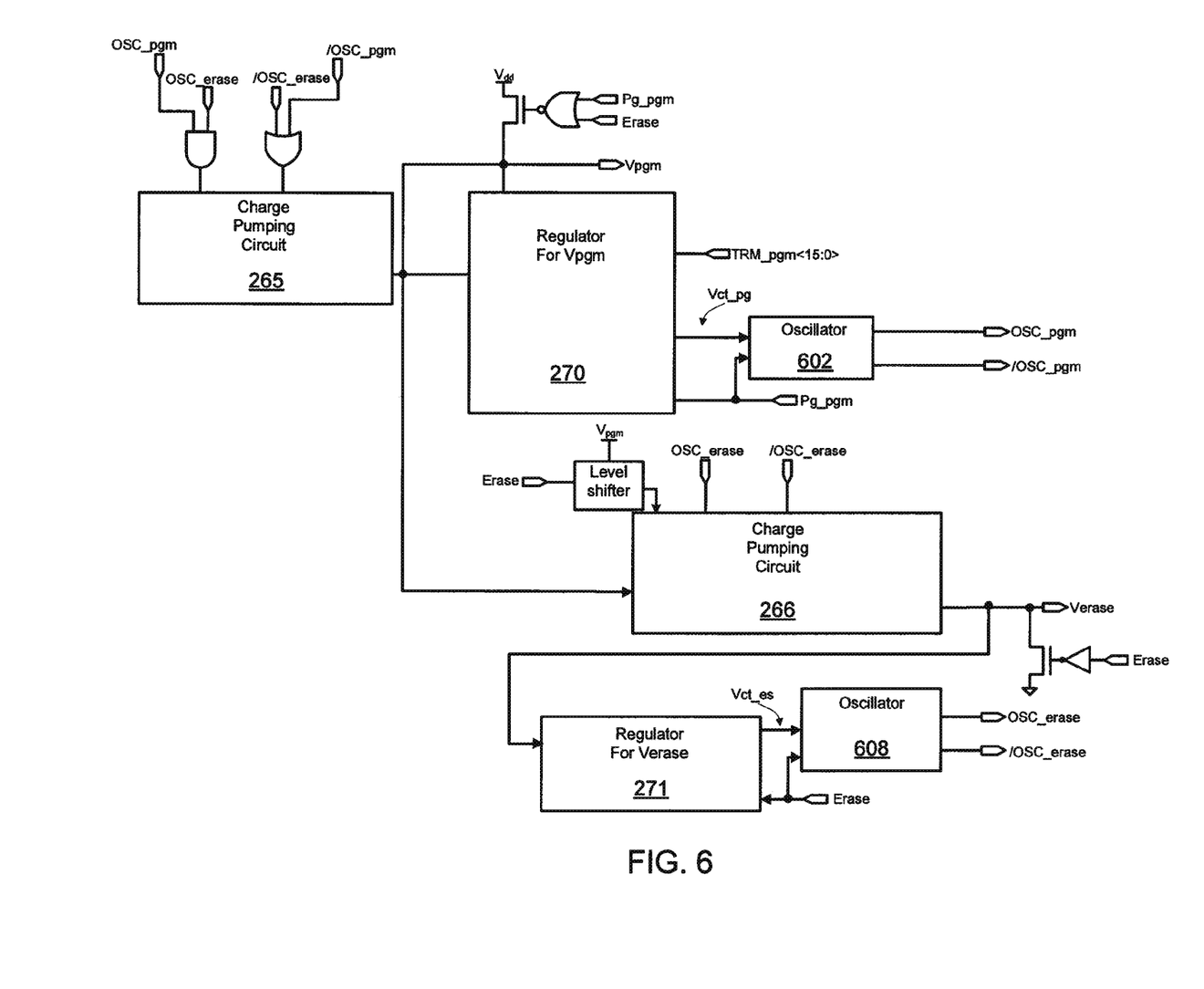
FIG. 6 is a block diagram, more detailed than the block diagram of FIG. 2B, of the second portion of the charge pump system.
Figure 7:
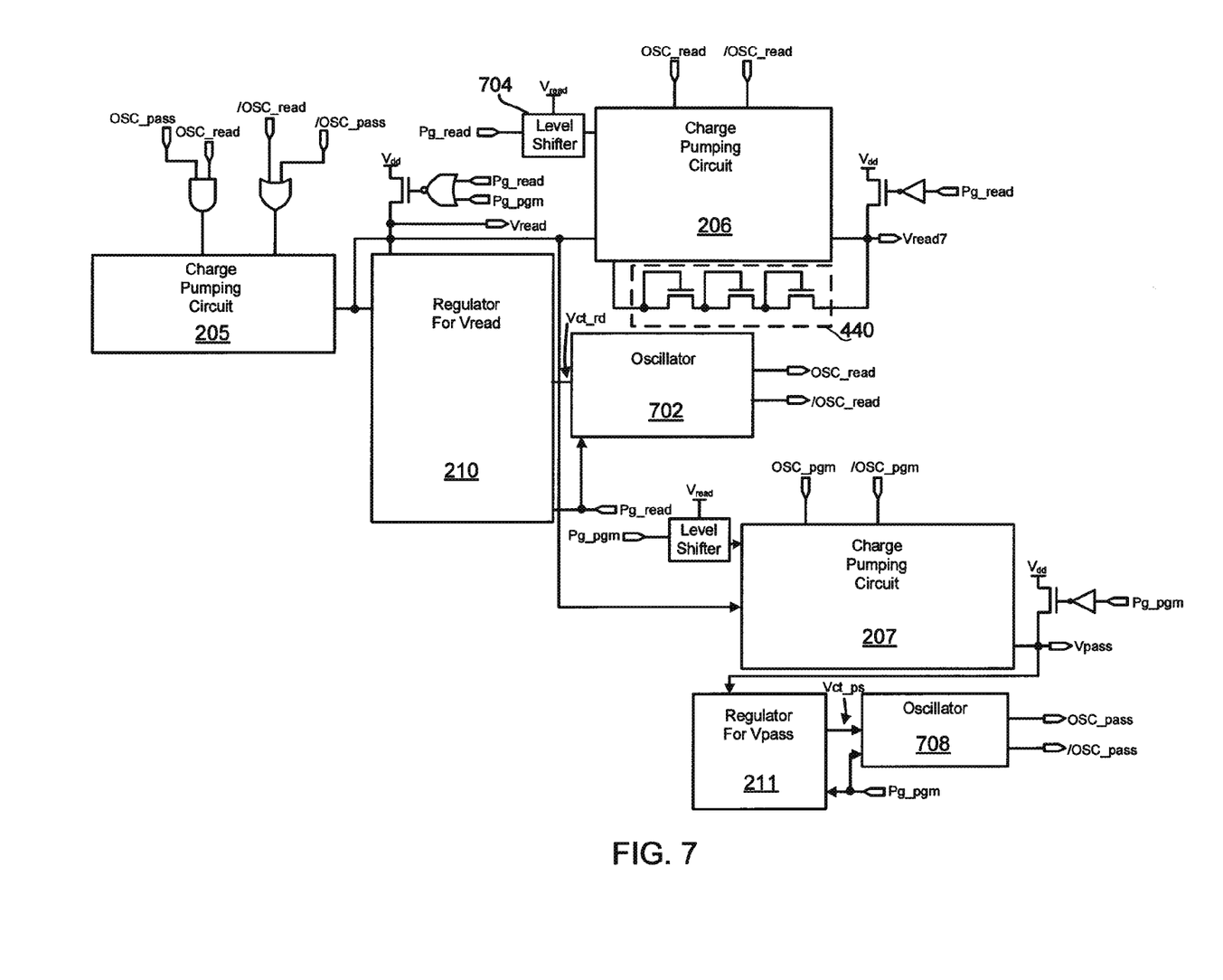
FIG. 7 is a block diagram, more detailed than the block diagram of FIG. 2A, of the first portion of the charge pump system.
Figure 8:
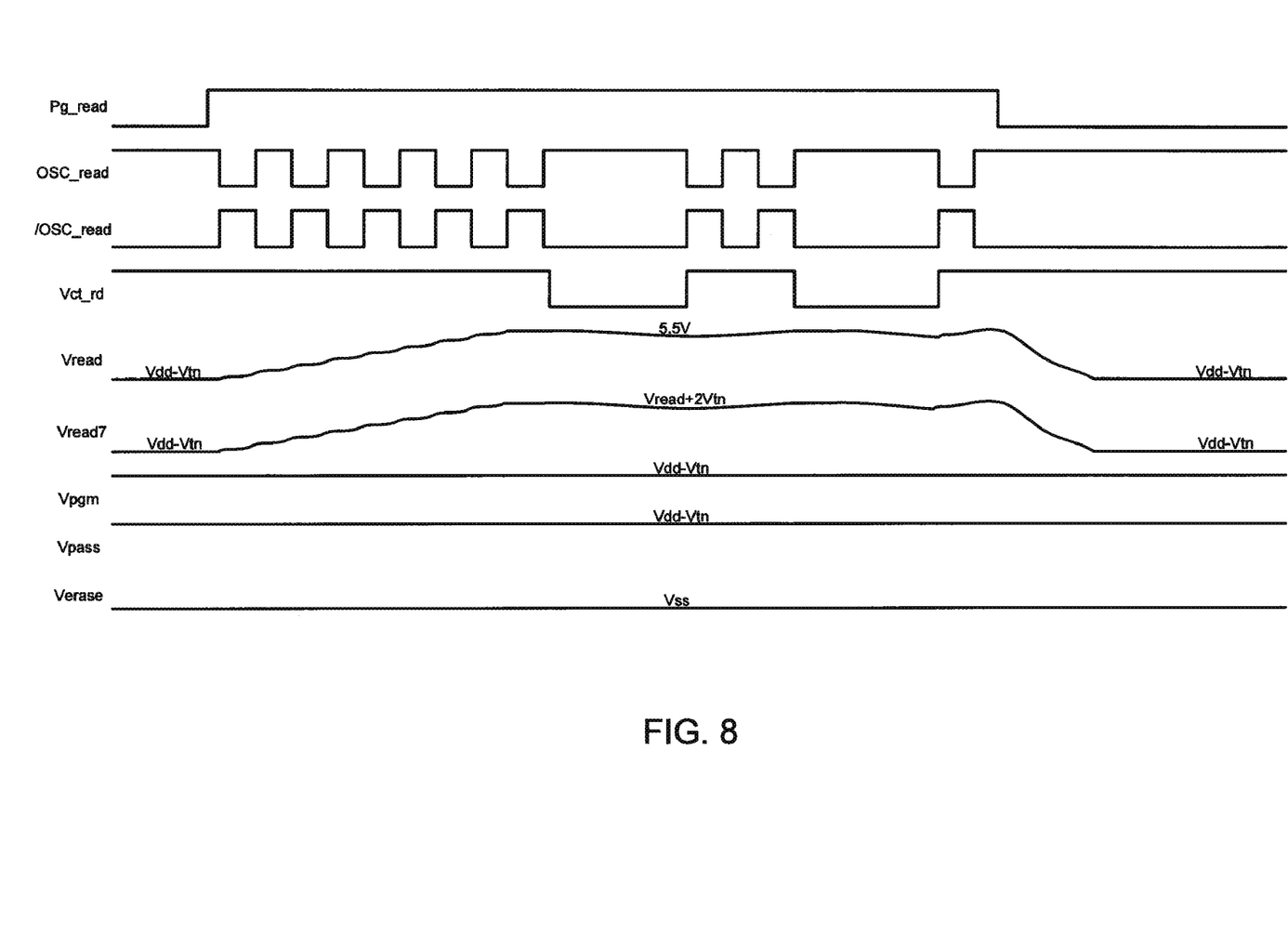
FIGS. 8-10 are example timing diagrams of waveforms for signals that may be generated within the example embodiment of the charge pump system shown in FIGS. 6-7.

Reference will now be made to FIGS. 6-8 in connection with a description of generation of voltage levels $V_{read}$ and $V_{read7}$ for a page read operation in accordance with an example embodiment. Firstly, $V_{pgm}$ and $V_{erase}$ are not required for a page read operation, and hence the pumping circuits 265 and 266 shown in FIG. 6 are not used. Also, neither is the pumping circuit 207 used, as $V_{pass}$ is not required for a page read operation. With respect to the generation of voltage levels $V_{read}$, $V_{read7}$ and others subsequently described, the generations are performed based on a loop operation of the pumping, and regulation of voltage level.

In the illustrated charge pump system, circuitries that are activated in connection with the generation of voltage levels $V_{read}$ and $V_{read7}$ for a page read operation include the pumping circuits 205 and 206, the regulator circuit 210, oscillator circuitry 702 and level shifter circuitry 704. Also, the signal Pg_read will be logic high.

During the generation of voltage levels $V_{read}$ and $V_{read7}$, the regulator circuit 210 starts monitoring the $V_{read}$ voltage level. Now if node vct_rd is logical high, then the oscillator 702 is enabled, and if the node vct_rd is logical low, then the oscillator 702 is disabled. Thus, if $V_{read}$ has not reached the target level as defined by the $V_{read}$ regulator circuit, node vct_rd becomes logical high, and it enables the oscillator 702 to produce two output oscillation signals (OSC_read and /OSC_read, which are fixed logical high and logical low respectively when the oscillator 702 is disabled). Signal transitions for OSC_read and /OSC_read during the voltage generation of the presently described example embodiment are illustrated in the timing diagram of FIG. 8. As will be seen from the timing diagram, the $V_{read}$ and $V_{read7}$ pumping circuits operate to increase the generated voltages when OSC_read and /OSC_read are oscillating between logical low and logical high.

In one example, $V_{read}$ is regulated to a voltage level of about 5.5V. In other examples, $V_{read}$ may be regulated to some other suitable voltage. As previously mentioned, $V_{read7}$ is two NMOS $V_{tn}$ levels above $V_{read}$. Also, as will be appreciated by those skilled in the art, $V_{read7}$ is used to transfer $V_{read}$ to the word line without loss of $V_{read}$ voltage level due to NMOS switch threshold voltage drop.

Figure 9:
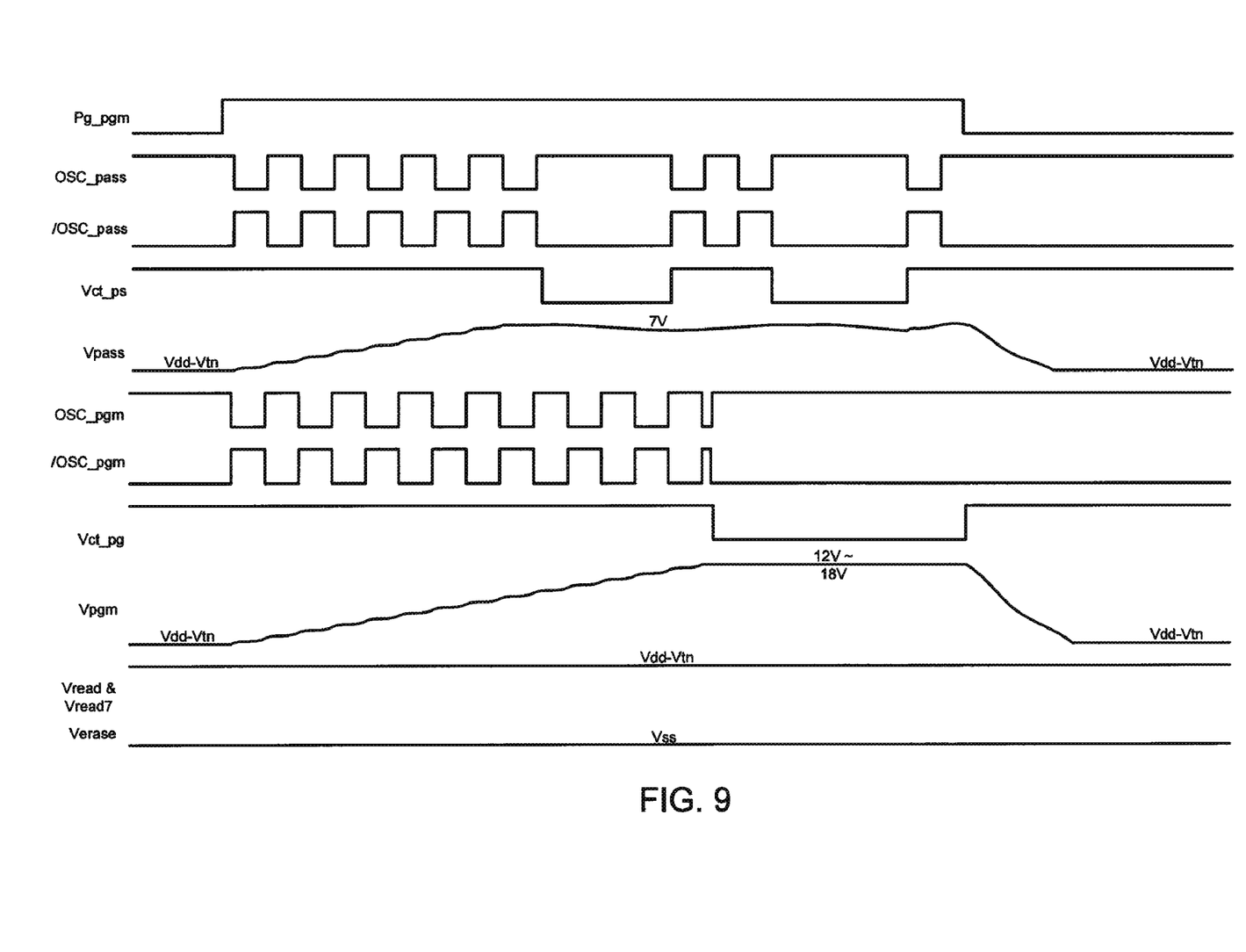

Reference will now be made to FIGS. 6, 7 and 9 in connection with a description of generation of voltage levels $V_{pgm}$ and $V_{pass}$ for a page program operation in accordance with an example embodiment. Firstly, $V_{read7}$ and $V_{erase}$ are not required for a page program operation, and hence the pumping circuits 206 and 266 shown in FIGS. 7 and 6 respectively, are not used. Also, with respect to $V_{pgm}$, its voltage level is varied depending on the program states of the selected page as will be understood by those skilled in the art. Therefore, it has variable levels, controlled by the TRM_pgm<15:0> signals as previously explained.

Now with respect to the $V_{pass}$ voltage, in one example this is about 7.0 V. In other examples, $V_{pass}$ may be some other suitable voltage. The $V_{read}$ pumping circuit 205 is used in generating $V_{pass}$ without enabling the $V_{read}$ regulator 210, and the pumped voltage level $V_{read}$-$V_{tn}$ is used as a source voltage level to the $V_{pass}$ pumping circuit 207.

Thus, there is shared usage of a pumping circuit, the $V_{read}$ pumping circuit 205 in the presently described example, in connection with the generation of more than one high voltage. In at least some examples, the shared pumping operation may achieve the following: i) better efficiency of the pumping circuit; and ii) reduction of the area of the pumping circuits which translates into smaller chip size. Also, those skilled in the art will appreciate that although $V_{read}$ is generated and transmitted to decoding blocks, this can be done without impacting the page program operation in terms of the decoding operation of row memory blocks.

It will be understood that Vct_ps, the voltage at the output node of the $V_{pass}$ regulator 211, is independently controlled by the level of $V_{pass}$. When Vct_ps is logical high, oscillator 708 is enabled producing output oscillation signals OSC_pass and /OSC_pass. By contrast, when Vct_ps is logical low, the oscillator 708 is disabled, and OSC_pass and /OSC_pass are fixed logical high and logical low respectively.

It will also be understood that Vct_pg, the voltage at the output node of the $V_{pgm}$ regulator 270, is independently controlled by the level of $V_{pgm}$. When Vct_pg is logical high, oscillator 602 is enabled producing output oscillation signals OSC_pgm and /OSC_pgm. By contrast, when Vct_pg is logical low, the oscillator 602 is disabled, and OSC_pgm and /OSC_pgm are fixed logical high and logical low respectively.

As will be seen from the timing diagram of FIG. 9, the $V_{pass}$ pumping circuit operates to increase the generated voltages when OSC_pass and /OSC_pass are oscillating between logical low and logical high, and also the $V_{pgm}$ pumping circuit operates to increase the generated voltages when OSC_pgm and /OSC_pgm are oscillating between logical low and logical high.

Figure 10:
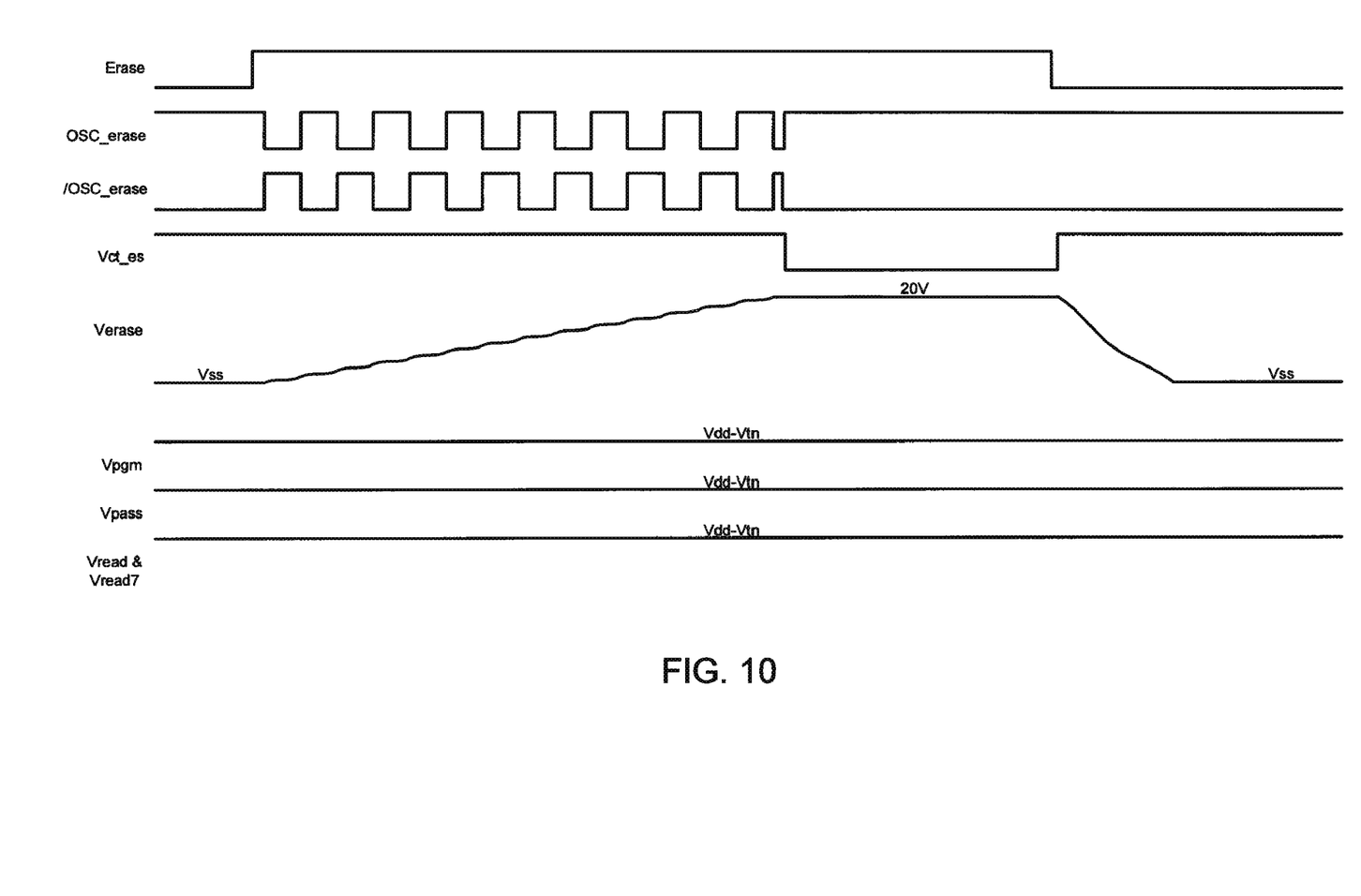

Reference will now be made to FIGS. 6, 7 and 10 in connection with a description of generation of voltage levels $V_{erase}$ and $V_{pgm}$ for an erase operation in accordance with an example embodiment. Firstly, $V_{read}$, $V_{read7}$ and $V_{pass}$ are not required for an erase operation, and hence the pumping circuits 205-207 shown in FIG. 7 are not used.

Now with respect to the $V_{erase}$ voltage, the $V_{pgm}$ pumping circuit 265 is used in generating $V_{erase}$ without enabling the $V_{pgm}$ regulator 270, and the pumped voltage level $V_{pgm}$-$V_{tn}$ is used as a source voltage level to the $V_{erase}$ pumping circuit 266. When an erase operation associated with the $V_{erase}$ voltage is being performed, $V_{pgm}$ may be set to any fixed value with the range of possible voltage values. In at least one example, the fixed value is between 12.0V and 18.0V.

Thus, there is shared usage of a pumping circuit, the $V_{pgm}$ pumping circuit 265 in the presently described example, in connection with the generation of more than one high voltage. In at least some examples, the shared pumping operation may achieve the following: i) better efficiency of the pumping circuit; and ii) reduction of the area of the pumping circuits which translates into smaller chip size. Also, those skilled in the art will appreciate that although $V_{pgm}$ is generated and transmitted to decoding blocks, this can be done without impacting the page program operation in terms of associated row decoding logic block.

It will be understood that Vct_es, the voltage at the output node of the $V_{erase}$ regulator 271, is independently controlled by the level of $V_{erase}$. When Vct_es is logical high, oscillator 608 is enabled producing output oscillation signals OSC_erase and /OSC_erase. By contrast, when Vct_es is logical low, the oscillator 608 is disabled, and OSC_erase and /OSC_erase are fixed logical high and logical low respectively. As will be seen from the timing diagram of FIG. 10, the $V_{erase}$ pumping circuit operates to increase the generated voltages when OSC_erase and /OSC_erase are oscillating between logical low and logical high.

In some example embodiments, a number of similar or the same pumping circuits in portion or portions of the charge pump system are connected in parallel to increasing driving capability. This may, for example, facilitate a high current requirement to be met for the associated voltage generation(s).

Figure 11:
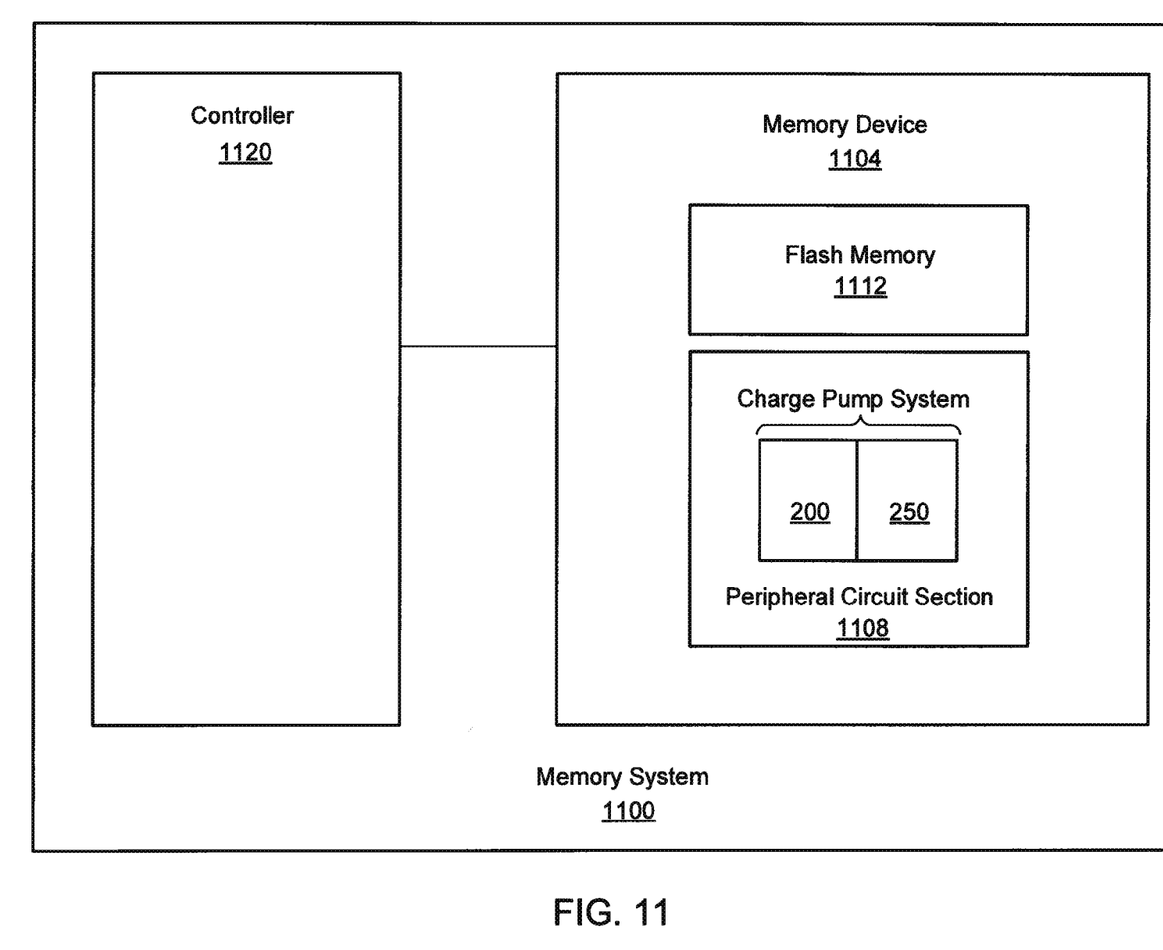
FIG. 11 is a block diagram of a flash memory system in accordance with example embodiments.

In addition to providing an improved nonvolatile memory device, conveniently the present invention may provide an improved memory system. FIG. 11 illustrates a memory system 1100 that includes a memory device 1104 that includes a charge pump system in accordance with previously described example embodiments. For convenience only one memory device 1104 is shown; however it should be noted that in some examples the memory system 1100 will includes a plurality of memory devices, some devices or all devices of which may be similar to the memory device 1104.

The memory device 1104 includes a peripheral circuit area or section 1108 within which the charge pump system can be found. The memory device 1104 also includes a flash memory 1112 comprising an array of memory cells which store data. The flash memory 1112 is not in the same section of the memory device 1104 as the peripheral circuit area 1108. A memory controller 1120 communicates commands to the flash memory 1112 and has other functions within the memory system 1100 as will be understood by those skilled in the art.

Various circuits and circuit components described in the preceding detailed description of example embodiments can be considered to be of a type performing known operations on electronic signals. Those skilled in the art will have knowledge of alternative circuits or circuit components which are recognized as equivalent because they provide the same operations on the signals.

Also, in some instances in which circuit schematics have been presented and described herein, certain details not sufficiently relevant to an understanding of example embodiments may have been omitted so as not to obscure inventive features disclosed herein.

Certain adaptations and modifications of the described embodiments can be made. Therefore, the above discussed embodiments are considered to be illustrative and not restrictive.

What is claimed is:

1. A flash memory device comprising:
a first section including flash memory for storing data; and
a second section including:
i) at least first and second pumping circuits having outputs, the second section being a peripheral circuit section, the first pumping circuit being configured to increase voltage produced therefrom under control of at least a first oscillation signal, and the second pumping circuit being configured to increase voltage produced therefrom under control of at least a second oscillation signal, different from the first oscillation signal;
ii) first and second regulator circuits; and
iii) first and second oscillators for providing the first and second oscillation signals respectively, the first regulator circuit coupled to the first pumping circuit output, the first oscillator configured to receive an outputted voltage of the first regulator circuit, the second regulator circuit coupled to the second pumping circuit output, and the second oscillator configured to receive an outputted voltage of the second regulator circuit, and
iv) wherein the first pumping circuit is configured to produce, at the first pumping circuit output, a first voltage required for carrying out a first type of memory operation, and the second pumping circuit being configured to produce, at the second pumping circuit output, a second voltage required for carrying out a second type of memory operation different than the first type of memory operation, and wherein the second pumping circuit pumps up from one transistor threshold voltage (Vtn) less than a voltage level of the first voltage.

2. The flash memory device as claimed in claim 1, wherein the first and second types of memory operations are read and program operations respectively.

3. The flash memory device as claimed in claim 1, wherein the second pumping circuit cooperatively employs the first pumping circuit to pump up from a voltage substantially greater than a voltage $V_{DD}$.

4. The flash memory device as claimed in claim 3, wherein the voltage V.sub.DD is 1.5V or less.

5. The flash memory device as claimed in claim 1, wherein the first regulator circuit includes at least two voltage dividers and an operational amplifier.

6. The flash memory device as claimed in claim 1, wherein the first regulator circuit includes trimming control circuitry.

7. The flash memory device as claimed in claim 1 wherein the flash memory comprises an array of memory cells.

8. The flash memory device as claimed in claim 1, wherein at least one of the first and second pumping circuits comprises a Dickson charge pump.

9. The flash memory device as claimed in claim 1, further comprising at least one additional pumping circuit working in parallel with the first pumping circuit to provide for increased current, the at least one additional pumping circuit being at least substantially similar to the first pumping circuit.

10. The flash memory device as claimed in claim 1, wherein the first and second oscillators comprise chains of inverters.

11. A method of producing voltages in a flash memory device having a first section including flash memory for storing data, and also having a second section that includes
 i) at least first and second pumping circuits, and
 ii) first and second oscillators, and the method comprising:
  supplying, within the flash memory device, a first voltage at a first voltage level to the first pumping circuit; producing, at an output of the first pumping circuit, a second voltage at a second voltage level that is higher than the first voltage level, the second voltage required for carrying out a first type of memory operation associated with the flash memory; producing, at an output of the second pumping circuit, and
 iii) a third voltage by cooperatively employing the first pumping circuit to pump up from a voltage greater than the first voltage, the third voltage at a third voltage level that is higher than the second voltage level, the third voltage required for carrying out a second type of memory operation associated with the flash memory, the second type of memory operation different than the first type of memory operation; providing, from the first oscillator, an at least one oscillation signal to the first pumping circuits, the second voltage level increasing under control of the at least one oscillation signal; and providing, from the second oscillator, an at least another oscillation signal to the second pumping circuit, the at least another oscillation signal different than the at least one oscillation signal, and the third voltage level increasing under control of the at least another oscillation signal.
 iv) wherein the first pumping circuit is configured to produce, at the first pumping circuit output, a first voltage required for carrying out a first type of memory operation, and the second pumping circuit being configured to produce, at the second pumping circuit output, a second voltage required for carrying out a second type of memory operation different than the first type of memory operation, and wherein the second pumping circuit pumps up from one transistor threshold voltage (Vtn) less than a voltage level of the first voltage.

12. The method as claimed in claim 11, wherein the first and second types of memory operations are read and program operations respectively.

13. The method as claimed in claim 11, wherein the first voltage is a voltage $V_{DD}$.

14. The method as claimed in claim 13, wherein the voltage V.sub.DD is 1.5V or less.

15. The method as claimed in claim 11, wherein the second type of memory operation is an erase operation.

16. The method as claimed in claim 15, further comprising carrying out the erase operation.

* * * * *